United States Patent [19]

Parfitt

[11] Patent Number: 4,618,848
[45] Date of Patent: Oct. 21, 1986

[54] ANALOG TO DIGITAL CONVERTER CIRCUIT

[75] Inventor: Steven P. Parfitt, Johnson City, Tenn.

[73] Assignee: Texas Instruments Incorporated, Dallas, Tex.

[21] Appl. No.: 681,518

[22] Filed: Dec. 14, 1984

[51] Int. Cl.$^4$ .............................................. H03M 1/10
[52] U.S. Cl. ....................... 340/347 CC; 340/347 AD
[58] Field of Search ................... 340/347 AD, 347 CC

[56] References Cited

U.S. PATENT DOCUMENTS 3,725,903  3/1973  Kosakowski ................. 340/347 AD
4,129,864  12/1978  Carpenter ..................... 340/347 AD
4,366,469  12/1982  Michaels ...................... 340/347 AD

OTHER PUBLICATIONS

Boyacigiller, "EDN" Aug. 18, 1982, vol. 27, No. 16, pp. 137–144.
Kinberg, "IBM Technical Disclosure Bulletin," vol. 9, No. 11, Apr. 1967, pp. 1537–1538.

Primary Examiner—Charles D. Miller
Attorney, Agent, or Firm—John A. Haug; James P. McAndrews; Melvin Sharp

[57] ABSTRACT

A circuit for converting analog to digital data uses a CMOS multiplexer, an analog to digital converter and an operational amplifier buffer controlled by a single chip microprocessor. An FET shunt circuit is connected to the input of the operational amplifier in order to pull the input to ground during a conversion cycle of the converter and the resulting data is read and used to adjust the data from subsequent data conversions to correct for offsets of the operational amplifier and the converter.

6 Claims, 3 Drawing Figures

ANALOG TO DIGITAL CONVERTER CIRCUIT

BACKGROUND OF THE INVENTION

The present invention relates generally to analog to digital converters and more specifically to low cost converters having improved accuracy and speed.

The use of a multiplexer coupled to an analog to digital converter through an operational amplifier buffer in order to convert some analog signal to a digital format is well known. By way of example, this procedure can be used anywhere one wishes to monitor an analog quantity such as pressure or temperature that can be converted into an electrical signal, either current or voltage, with the resulting output digital data displayed through a liquid crystal or the like or used to input an external machine such as a programmable controller. Very reliable systems having excellent operation characteristics can be provided by selecting a high performance multiplexer having low output leakage current along with an operational amplifier having a low offset voltage $V_{OS}$ however such systems are excessively expensive for many applications.

The overall cost of such a circuit could be significantly decreased by using inexpensive, low performance components if the cost of eliminating sources of error in the component parts can also be kept low. Such sources of error include the offset voltage $V_{OS}$ of the operational amplifier and, when the clock rate at which the converter operates is increased to optimize overall operation for given component parts, a comparator delay in the analog to digital converter. That is, running the analog to digital converter faster than it is normally used introduces a comparator delay which results in an error or offset. It has been suggested that this can be dealt with by placing a resistance in series with the integrating capacitor of the converter however this is unsatisfactory in that the required resistance is not only very large, it varies from one unit to another resulting in undesirable and expensive tailoring of each unit.

BRIEF SUMMARY OF THE INVENTION

It is therefor an object of the invention to provide an improved low cost analog to digital converter circuit, one which reduces the effects of the comparator delay in the circuit and offset voltage of the operational amplifier; It is another object to provide a circuit which has improved accuracy, is fast and reliable and is consistent from one unit to another.

In accordance with the invention an analog to digital control circuit having a multiplexer coupled to an analog to digital converter through an operational amplifier buffer has means to pull the input of the operational amplifier to ground during a conversion cycle of the converter with the resulting data used to correct subsequent conversions of channel data.

According to a feature of the invention for each scan of cycles of an M channel converter, a reading is taken at an M+1 cycle with no input to the operational amplifier and then automatically at the end of each subsequent conversion of M cycles the data is zeroed by subtracting (or adding as the case may be) the particular offset. This cycle is referred to herein as the AUTO-ZERO cycle.

According to a feature of the invention, the input to the operational amplifier is pulled to ground preferably by a discrete field effect transistor (FET) having symmetrical gate-source and gate-drain structure. However it is within the purview of the invention that when using multiplexers having particularly low output leakage, the input to the operational amplifier could be pulled to ground through a resistance divider.

BRIEF DESCRIPTION OF DRAWINGS

The present invention, as well as further objects and advantages thereof, may be more fully understood from the following description of the preferred embodiment in conjuction with the drawings, in which:

As seen in FIG. 1 an M channel analog input module for use with a liquid crystal or LED display or an external machine such as a digital programmable controller includes an M channel multiplexer 12 to connect the several analog signals 14 to an analog to digital converter 16 under the control of a microprocessor 18. In a module made in accordance with the invention multiplexer 12 was a CD4051 providing eight single ended channels of bipolar voltage input or eight single ended sinking current inputs, each channel amenable to either type of input independently of the other channels. For current inputs, a precision resistor is placed from the voltage input of the applicable channel to ground. The resistor is chosen so that with a maximum current in, 5 volts is expressed across the resistor.

Figure 1:
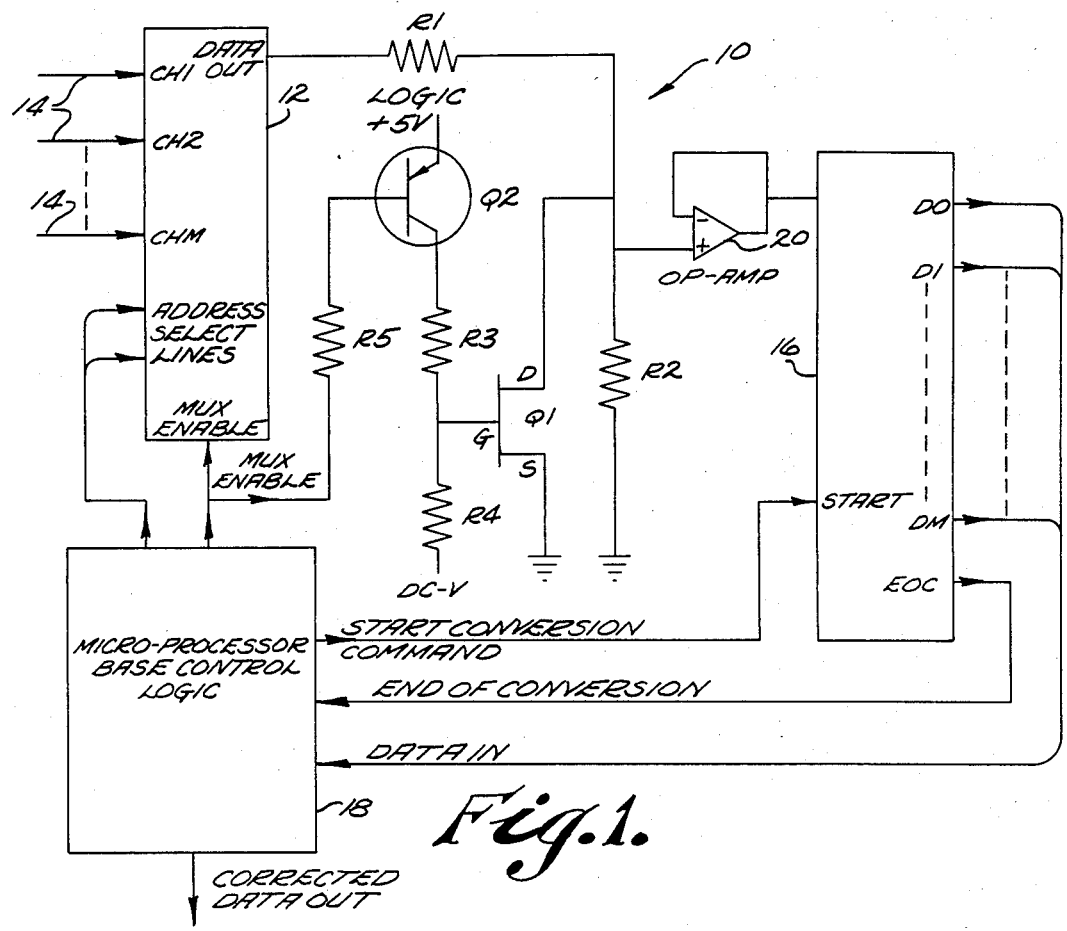
FIG. 1 is a schematic circuit diagram of the present invention.

The digital to analog converter 16 was a 7109 CPL, a dual slope integration type in which a capacitor is connected to a reference voltage and charged during a known number of timing pulses. The capacitor is then discharged through the voltage to be measured, the discharge time being proportional to the value of the voltage to yield the digital result.

The microprocessor 18 was an 8048 containing its own ROM, RAM and I/O. Microprocessor 18 monitors the status returned from converter 16 to determine when the channel conversion is completed and then disables multiplexer 12, advances to the next channel, reenables the multiplexer and reads back the digital data from the previous conversion.

The output of multiplexer 12 is buffered by operational amplifier 20. The negative input of amplifier 20 is connected to its output and the positive input is connected through a resistor divider to ground. The resistor divider comprises R1 connected on one side to the DATA OUT pin of multiplexer 12 and on the other side to R2 which in turn is connected to ground. The values of R1 and R2 are selected to scale the input voltages to prevent subjecting the converter to an overvoltage.

A field effect transistor (FET) Q1 is coupled to amplifier 20 in order to pull the input to amplifier 20 to ground when turned on. Drain D of Q1 is connected to the positive input of amplifier 20, its source S is connected to ground and its gate G is connected to a drive circuit comprising a level shifter and resistor divider to provide a selected $V_{GS}$ voltage when Q2 is off and a selected minimum $V_{GS}$ voltage when Q2 is on in order to insure that $V_{DS}$ is less than one least significant bit of converter 16. Gate G is connected between resistors R3 and R4 with resistor R4 connected to minus DC V-voltage. Resistor R3 is connected to the collector of a PNP transistor Q2 whose emitter is connected to logic plus 5 volts. The base of transistor Q2 is coupled to the MUX ENABLE pin of microprocessor 18 through resistor R5.

Transistor Q2 is used as a gate driver with its collector resistor being a voltage divider circuit. A PNP transistor is employed in preference to an NPN in order to pull the transistor up hard. The gate source voltage is tightly controlled by using a pair of precision resistors R3 and R4. With the transistor off there is effectively no current flowing through R3 with gate resistor R4 pulling the gate down to the minus supply.

When a drive signal is applied in the ENABLE line, that line is pulled low to disable the multiplexer. Base resistor R5 then serves as a current limiting resistance to control the amount of current through the base emitter junction so that it is not overdriven.

Figure 2:
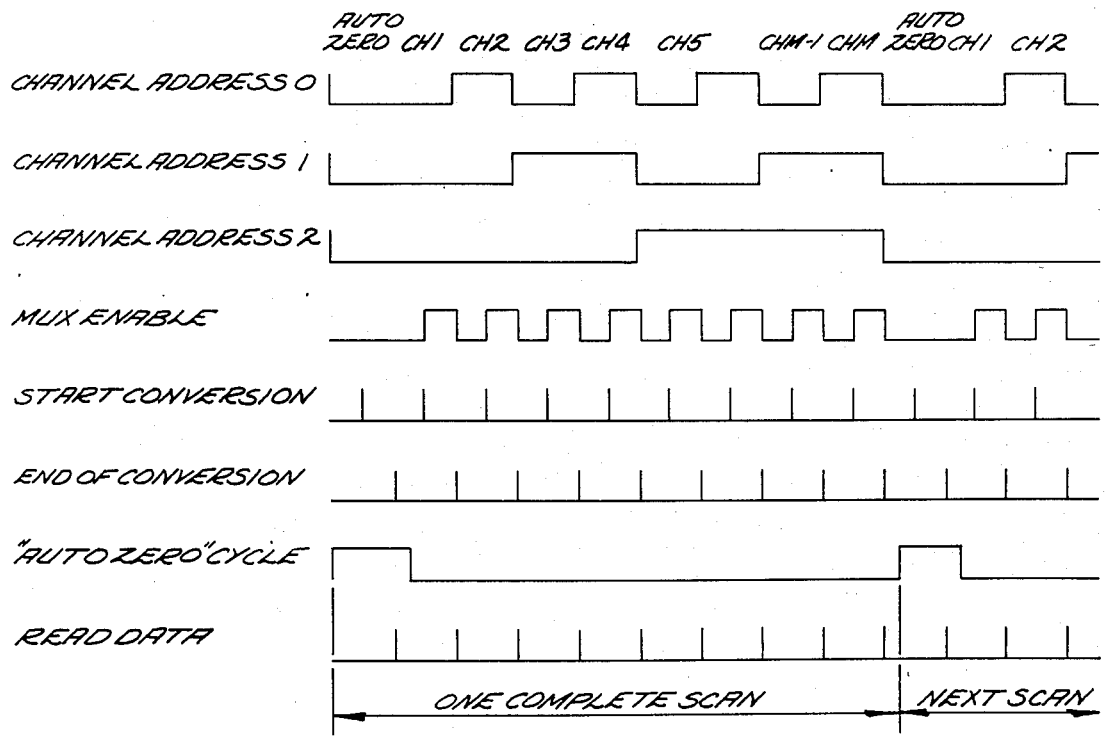
FIG. 2 is a timing diagram for the FIG. 1 circuit.

With reference to FIGS. 1 and 2 of the drawings, microprocessor 18 selects the appropriate channel through the CHANNEL ADDRESS SELECT LINES, sends out a MUX ENABLE signal to turn on multiplexer 12 and initiates a conversion cycle by sending out a START CONVERSION COMMAND. When the conversion is completed an END OF CONVERSION signal is sent back to microprocessor 18 from the EOC pin of converter 16 and multiplexer 12 is then disabled, the next channel is selected and the process is repeated until all the channels have been processed and the sequence begins again.

An additional analog to digital conversion cycle, M+1, is performed at the beginning of each M (eight) channel sequence. This is an AUTO-ZERO cycle and is performed with the multiplexer turned off allowing the system to measure the inherent offset in the analog input amplifier 20 and converter 16. This data is adjusted (subtracted or added) from the input data from each of the next M conversions to provide offset adjustment. The system is able to measure the inherent offset in the analog input buffer amplifier 20 and converter 16. FET Q1 insures rapid settling to zero between channels and shunts the input of amplifier 20 to ground during the AUTO-ZERO cycle.

The specific components used in a circuit module or unit 10 made in accordance with the invention are as follows:
multiplexer 12: CD4051, R1, 392K ohms;
A/D converter 16: 7109 CPL, R2, 576K ohms;
OP-AMP 20: LF-353, R3, 4.99K ohms;
microprocessor 18: 8048, R4, 7.23K ohms;
Q1: 2N3821, R5, 10K ohms;
Q2: 2N3906.

The values of R1 and R2 are chosen to prevent the input to operational amplifier 20 from overdriving it and depend on the expected analog input value, the particular operational amplifier chosen and the power supplies available. For circuit 10 with the above components the maximum input voltage was +/− 8.2 volts while amplifier 20 had a maximum input voltage of +/− 4.88 volts with the noted power supply. Based on the expected analog input values, and a required 1 meg ohm input resistance the resistor divider had a top resistor (R1) value of 392K ohms and a bottom resistor (R2) of 576K ohms. The maximum the cirucit is expected to convert is +/− 5.12 volts resulting in a converter 16 input of +/− 2.97 volts.

FET Q1 is chosen to have a symmetrical gate to source and gate to drain structure to facilitate handling of bipolar voltages. The $V_{GS(off)}$ of the FET is kept as low as possible to insure low leakage current in the off state so that input data is not affected when Q1 is off.

The 2N3821 transistor used has a $V_{GS(off)}$ specified as −4.0 volt maximum at 0.5 na $I_{DS}$. Thus the supply voltage required to insure that Q1 is off is −4.0+ −2.97 or 6.97 volts. A power supply having a minimum of −7.2 volts was used in the circuit.

In the gate drive circuit of Q1 the level shifter and resistor divider was chosen to provide a $V_{GS}$ voltage of −7.2 volts when Q2 is off and a $V_{GS}$ of −0.026 volts ($V_{GS}$ maximum of −0.401 volts) when Q1 is on. This is sufficient to insure that $V_{DS}$ is less than 1 least significant bit (LSB) of converter 16.

A symmetrical gate-source and gate-drain structure allows a single FET device to be used as the switch for bipolar input signals virtually equally well (leakage currents will be slightly lower for the positive input signals due to the greater $V_{GS}$ voltage under those conditions). Further, an FET device having such low $V_{GS(off)}$ and $V_{GS(on)}$ makes it possible to use much lower supply voltages to handle the same analog input voltage range than would otherwise be the case. The voltage divider R1, R2 further increases that range.

The use of a discrete FET device makes it possible to achieve lower circuit costs over integrated circuits with the same leakage and resistance characteristics. The use of a single chip microprocessor with on-chip memory and I/O ports as a programmable logic device to perform logic and mathematical functions further reduces the complexity of the circuit.

Figure 3:
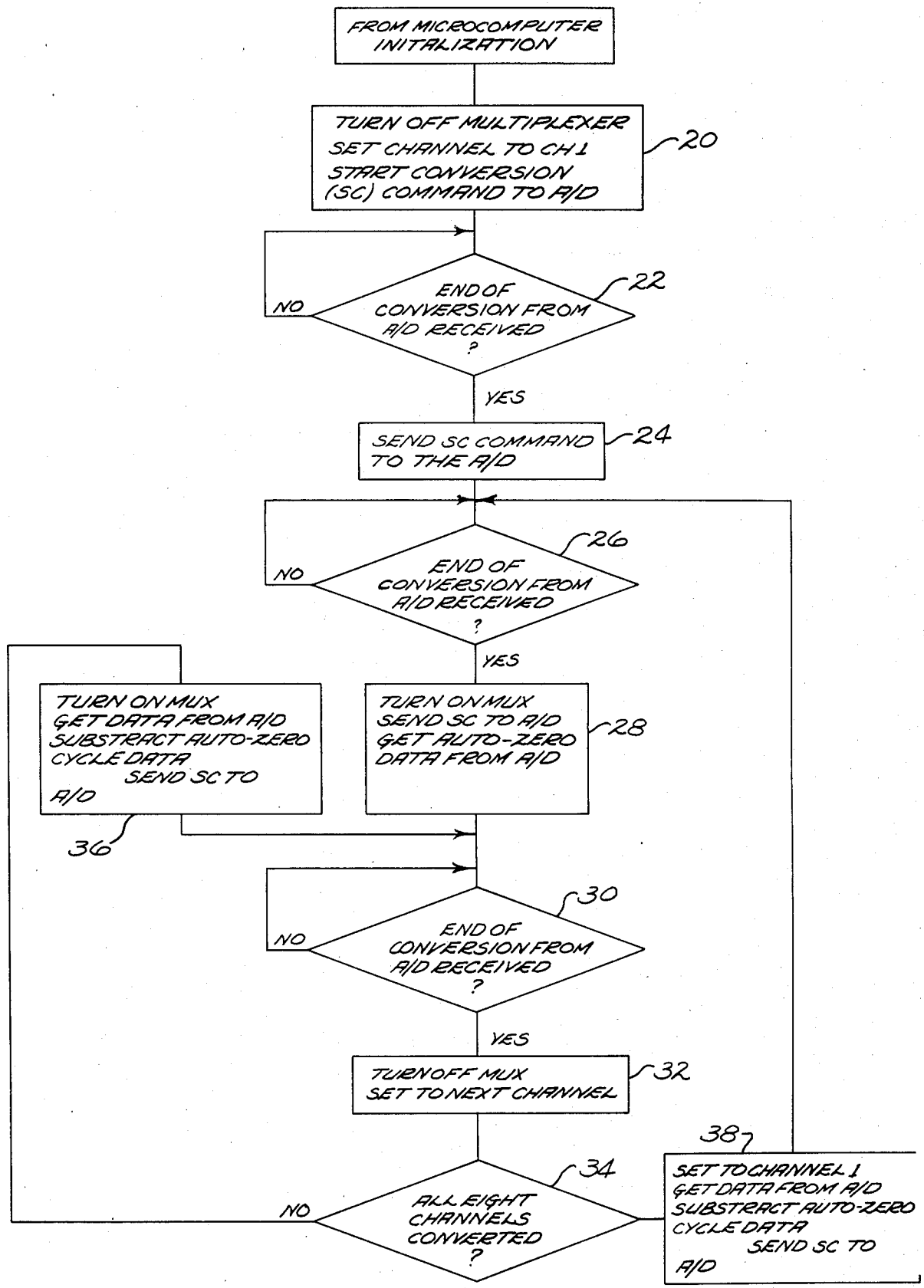
FIG. 3 is a logic diagram generally depicting the operation of the circuit.

Based on the disclosure given to this point, it is believed that a programmer of ordinary skill in the art could implement the operation of the circuit as described. Nonetheless, to insure that a complete disclosure of the invention is given, reference may be had to FIG. 3 which depicts the logic necessary to implement an operative circuit.

The module is initialized to flush the converter to eliminate all data which may be stored therein. Following initialization, the logic flow includes processing blocks 20, 24, 28 and 32 and decision blocks 22, 26, 30 and 34 with feedback loops from decision block 34 considering whether all the channels have been converted, if not, processing block 36 turns on the multiplexer, gets data from the converter, adjusts the auto-zero data and sends start conversion command (SC) to the converter. If all channels have been converted, processing block 38 sets the address back to channel 1, gets data from the converter, adjusts the auto-zero data and sends the start conversion command to the converter. It should be noted that the auto-zero adjustment involves determining the polarity of both data words and adding or subtracting depending on if other signs are different or the same. In the case of opposite signs a check is made for sign change of the main data.

By means of the present invention an extremely effective yet simple way has been provided to improve the accuracy of a multichannel analog input module by pulling the input of the operational amplifier to ground for one conversion cycle using an FET device as a switch to shunt the input to ground. The invention can be used with any piece of laboratory or commercial equipment that monitors analog quantities that process the data in digital form such as anemometers, digital thermometers or various process controllers.

Having described the invention in connection with a specific embodiment thereof it is to be understood that modifications may now suggest themselves to those skilled in the art and it is intended to cover such modifications as fall within the scope of the appended claims.

What is claimed is:

1. A circuit for converting M channels of analog data to digital data for use with an external machine comprising:
   an M channel multiplexer having M channel analog inputs, channel address select lines, an enable line and an output data line,
   an analog to digital converter having an input and digital data outputs,
   processing means coupled to the multiplexer through the channel address selected lines and the enable lines and coupled to the converter to monitor the status of the converter and control the operation of the multiplexer and converter to sequentially convert the input analog data from each of the M channels in a scan of M+1 conversion cycles,
   an operational amplifier having an input coupled between the multiplexer and the converter to buffer the analog input data to the converter,
   first and second resistors connected together to form a resistor divider, the input of the operational amplifier connected to the divider, the first resistor connected to the output data line of the multiplexer to reduce the input voltage to the amplifier,
   and means to pull the input of the operational amplifier to ground during one conversion cycle for each scan of cycles comprising a field effect transistor having a drain connected to the amplifier input and a source connected to ground and having symmetrical gate-source and gate-drain structure, the field effect transistor having a gate circuit coupled to the processing means, the processing means controlling the operation of the multiplexer by sending a signal on the enable line, the enable line connected to the gate circuit, such that each time the multiplexer is turned off the field effect transistor is turned on to shunt the amplifier input to ground.

2. A circuit according to claim 1 in which the gate circuit comprises a resistor divider having a junction, a DC voltage source, a logic voltage source and a PNP transistor, the gate of the field effect transistor connected to the junction of the resistor divider, the resistor divider coupled between the DC voltage source and the collector of the PNP transistor, the emitter of the PNP transistor connected to the logic voltage source and the gate of the PNP transistor connected to the enable line.

3. In a circuit for converting input analog data to digital data having a CMOS M channel multiplexer, an analog to digital converter, a buffer operational amplifier coupled between the multiplexer and the converter driving the converter and control logic means coupled to and controlling the operation of the multiplexer and converter to sequentially convert the input analog data from each of the M channels in a scan of the conversion cycles, the improvement comprising a shunt circuit having a field effect transistor with a gate, source and drain having symmetrical gate-source and gate-drain structure, the drain connected to the input of the operational amplifier, the source connected to ground and the gate connected to the control logic means, the control logic means adapted to pull the input of the operational amplifier to ground for an M+1 conversion cycle of the converter for each scan.

4. In a circuit according to claim 3 further including a resistor divider coupled to the input of the operational amplifier to scale down the input voltage to the operational amplifier.

5. In a circuit according to claim 3 in which the coupling of the control logic means to the multiplexer includes an enable line and the enable line is also connected to the gate through a gate circuit so that whenever the multiplexer is disabled the field effect transistor is turned on.

6. In a circuit according to claim 5 in which the output data of the converter during the M+1 conversion cycle is stored and is then subtracted in the next scan for subsequent converted channel data to correct offset voltages in the operational amplifier and the converter.

* * * * *